United States Patent
Bunt et al.

(10) Patent No.: US 6,964,906 B2
(45) Date of Patent: Nov. 15, 2005

(54) PROGRAMMABLE ELEMENT WITH SELECTIVELY CONDUCTIVE DOPANT AND METHOD FOR PROGRAMMING SAME

(75) Inventors: Patricia S. Bunt, Essex Junction, VT (US); John J. Ellis-Monaghan, Grand Isle, VT (US)

(73) Assignee: International Business Machines Corporation, Armonk, NY (US)

( * ) Notice: Subject to any disclaimer, the term of this patent is extended or adjusted under 35 U.S.C. 154(b) by 131 days.

(21) Appl. No.: 10/064,317

(22) Filed: Jul. 2, 2002

(65) Prior Publication Data
US 2004/0004267 A1    Jan. 8, 2004

(51) Int. Cl.[7] .................................... H01L 21/336
(52) U.S. Cl. .............. 438/308; 438/131; 438/600; 438/601; 438/215; 438/281; 438/132
(58) Field of Search ................ 438/131, 132, 438/215, 281, 308, 333, 467, 600, 601, 795, 438/798, 799, 514, 522, 530, 535, 540, 17; 257/529

(56) References Cited

U.S. PATENT DOCUMENTS 4,198,246 A * 4/1980 Wu ........................ 428/446

(Continued)

FOREIGN PATENT DOCUMENTS

EP    0697708 A1    2/1996

(Continued)

OTHER PUBLICATIONS

Somit Talwar et al. "Ultra-Shallow, abrupt, and highly-activated junctions by low-energy ion implantation and laser annealing", 1999, IEEE, pp. 1171–1174.*

(Continued)

*Primary Examiner*—Maria F. Guerrero
(74) *Attorney, Agent, or Firm*—Schmeiser, Olsen & Watts; Anthony Canale

(57) ABSTRACT

A programmable element including a semiconductor material doped with a dopant that alters the resistance of the element when exposed to actinic radiation. Rather than producing a mechanical deformation, the radiation rearranges the bonding configuration of the dopant in the element, allowing it to be placed on a chip in close proximity to other device structures without risking damage to those structures. After formation, the programmable element is subjected to a laser anneal process in which the dopant is electrically activated. The activation process allows the dopant to donate a charge carrier to the crystal structure. Rapid cooling following laser anneal preserves the desired bonding configuration of the dopant produced in the programmable element. Laser anneals have been shown to reduce the resistivity of a programmable element by at least a factor of two.

12 Claims, 8 Drawing Sheets

U.S. PATENT DOCUMENTS

| | | | |
|---|---|---|---|
| 4,233,671 A * | 11/1980 | Gerzberg et al. | 365/105 |
| 4,462,150 A * | 7/1984 | Nishimura et al. | 438/128 |
| 4,617,723 A * | 10/1986 | Mukai | 438/600 |
| 4,628,590 A | 12/1986 | Udo et al. | |
| 4,677,742 A * | 7/1987 | Johnson | 438/131 |
| 4,835,118 A * | 5/1989 | Jones, Jr. et al. | 438/131 |
| 4,845,045 A * | 7/1989 | Shacham et al. | 438/529 |
| 5,146,307 A | 9/1992 | Kaya | |
| 5,182,225 A | 1/1993 | Matthews | |
| 5,585,662 A | 12/1996 | Ogawa | |
| 5,627,400 A | 5/1997 | Koga | |
| 5,795,627 A * | 8/1998 | Mehta et al. | 427/526 |
| 5,814,876 A | 9/1998 | Peyre-Lavigne et al. | |
| 5,882,998 A | 3/1999 | Sur, Jr. et al. | |
| 6,168,977 B1 | 1/2001 | Konishi | |
| 6,180,993 B1 | 1/2001 | Wang et al. | |
| 6,198,149 B1 | 3/2001 | Ishigaki | |

FOREIGN PATENT DOCUMENTS

| | | |
|---|---|---|
| JP | 58139460 A | 8/1983 |
| JP | 61187253 A | 8/1986 |
| JP | 63169041 A | 7/1988 |
| JP | 7273205 A | 10/1995 |

OTHER PUBLICATIONS

C. Laviron et al. "Excimer-laser activation of dopants in silicon: a new concept for uniform treatment over whole die area", 2001, IEEE, pp. 91-94.*

Journal of Applied Physics, "Arsenic Deactivation Enhanced Diffusion: A Time, Temperature, and Concentration Study", Rousseau, et al., vol. 84, No. 7, pp. 3593-3601, Oct. 1998.

* cited by examiner

PROGRAMMABLE ELEMENT WITH SELECTIVELY CONDUCTIVE DOPANT AND METHOD FOR PROGRAMMING SAME

BACKGROUND OF THE INVENTION

Technical Field

This invention generally relates to semiconductor circuit fabrication, and more specifically relates to programmable elements in semiconductor devices.

The proliferation of electronics in the modern world is due in large part to the development of integrated circuit semiconductor devices. Because these devices are designed and used for widely differing applications, it is often beneficial to have the ability to program the logic on a semiconductor device during its fabrication. Logic programmability of a semiconductor device involves changing or customizing the device circuitry to meet the requirements of a specific application. Semiconductors may also be constructed with duplicate circuit paths as another means of quality control. The redundancy afforded by the inclusion of duplicate paths may allow a device to function even when part of the chip is damaged, or when a part underperforms.

It is rarely cost effective to create a separate fabrication line, with customized masks and other associated fabrication features, for each type of semiconductor device, no matter how small the differences in their circuit requirements. It is much more efficient to produce a wide variety of devices intended for many different applications on a single fabrication line, and to build logic programmability into each device so that each can then be programmed to perform as needed for its particular application. In one customization technique, a programmable element such as a fuse or an antifuse may be programmed such that current pathways on the chip conform to the desired specifications. In one embodiment of this technique, an existing circuit path may be cut by blowing a fuse that has been placed in the path for that purpose. After the fuse has been blown, the circuit path of which it was a part no longer exists, and current is then directed along different pathways in the device. In another embodiment, a circuit path may be created where none existed before by programming an antifuse to carry current.

Programmable elements such as those discussed above represent one method for implementing redundancy and logic programmability in a semiconductor. Some conventional programming events, in which a programmable element is programed to carry current as needed in a chip, are fairly violent occurrences that result in substantial mechanical deformation of the element, In one conventional technique, for example, fuses constructed from metal lines are blown using a laser beam to evaporate the metal. This technique can cause damage to structures adjacent to the fuse, whether due to the spattering of molten metal, the inability to focus the laser beam only on the targeted fuse, unwanted reflections from the laser beam off the target fuse, or other reasons. The conventional solution to this problem of placing fuses far away from other structures on the chip is itself a problem because it leads to results such as increased device size, higher costs, and lowered efficiency. Electrically programmable fuses, or E-fuses, are programmed by applying a high voltage to them, and thus do not suffer from the problems affecting laser blown fuses. E-fuses may thus be closely spaced on a chip. Unfortunately, however, E-fuses suffer from reliability problems. For example, the blown metal in an E-fuse can oxidize in a moist environment, causing "grow-back." The size of the metal pieces increases when the metal oxidizes, allowing them to connect and once again permit current flow.

BRIEF SUMMARY OF THE INVENTION

Therefore, there exists a need for a programmable element suitable for use in a semiconductor device that may be programmed without damaging nearby chip structures, and that may be safely located in close proximity to those structures. The present invention fills that need by providing a programmable element comprising a semiconductor material doped with a dopant that alters the resistance of the element when exposed to actinic radiation. Because the change in resistance is due to a rearrangement of the bonding configuration of the dopant in the element by actinic radiation, rather than to an actual mechanical deformation, many such elements may be closely packed on a chip without concern that they will be damaged by programming events.

In one embodiment of the invention, a silicon based structure is doped with arsenic to create a fuse, and the arsenic is electrically activated with a laser anneal. The high temperature produced in the fuse by the laser causes arsenic atoms to combine with silicon atoms in such a way that the arsenic is able to donate an electron to the silicon crystal, where it is available to act as a charge carrier. The laser energy pulse is quick enough that the fuse is able to cool rapidly after arsenic activation, thus preserving the desired molecular structure in the programmable element. Laser anneals have been shown to reduce the resistivity of a programmable element by a factor of two or more.

BRIEF DESCRIPTION OF THE SEVERAL VIEWS OF THE DRAWINGS

The foregoing and other features and advantages of the invention will be apparent from the following more particular description of specific embodiments of the invention, as illustrated in the accompanying drawings, wherein.

DETAILED DESCRIPTION OF THE INVENTION

The present invention provides a programmable element comprising a semiconductor material doped with a dopant that alters the resistance of the element when exposed to actinic radiation. The radiation rearranges the bonding configuration of the dopant in the crystalline structure of the element and thus does not require a mechanical deformation, allowing the element to be placed on a chip in close proximity to other chip structures without risking damage to those structures. After formation, the programmable element is subjected to a laser anneal process in which the dopant is electrically activated. The activation process allows n-type dopant to donate an electron, or p-type dopant to donate a hole, to the semiconductor material, where it is available to act as a charge carrier. In some embodiments, the semiconductor material is a crystalline lattice which may comprise silicon, as will be more fully discussed below. Rapid cooling following laser anneal preserves the desired molecular structure produced in the programmable element. Laser anneals have been shown to reduce the resistivity of a programmable element by at least a factor of two. In this description of the invention, the phrase "programmable element" means any chip structure with an adjustable resistance. This includes a device conventionally referred to as a fuse, which converts a closed circuit into an open circuit, and a device conventionally known as an antifuse, which converts an open circuit into a closed circuit. It also includes a device like a trimmable resistor that may be physically altered in order to effect a change in its resistance.

Figure 1:
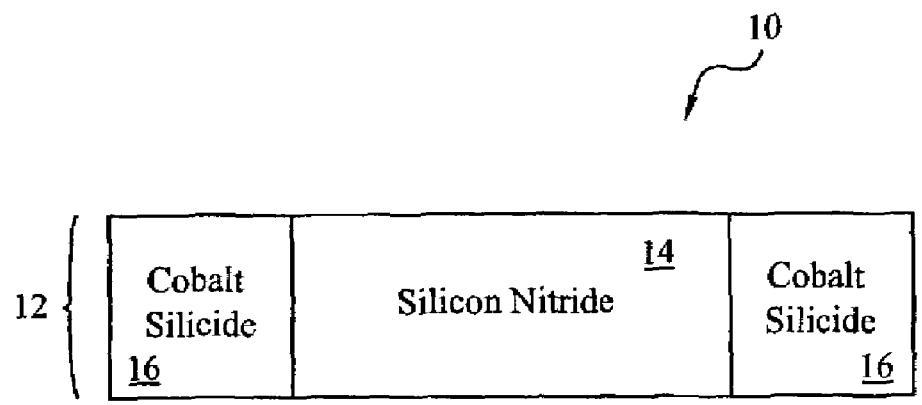
FIG. 1 is a top view of a programmable element configured according to an embodiment of the present invention.

Referring now to the figures, FIG. 1 is a top view of a programmable element configured according to an embodiment of the present invention. A first layer 12 of a programmable element 10 comprises a cap layer 14 and a contact layer 16. Programmable element 10 is adapted for use in a semiconductor, not shown. Contact layer 16 provides a low-resistance electrical contact between the circuit or chip and programmable element 10. Suitable materials for contact layer 16 include cobalt silicide, titanium silicide, nickel silicide, and palladium silicide. Other materials, with or without a silicide component, may also be suitable. Cap layer 14 may be any electrically insulating material, such as silicon nitride or silicon dioxide. In the figures, programmable element 10 is depicted as having a cap layer comprising silicon nitride and contact layers comprising cobalt silicide, but this should not in any way be understood to limit the scope of the present invention to those materials or to that embodiment.

Figure 2:
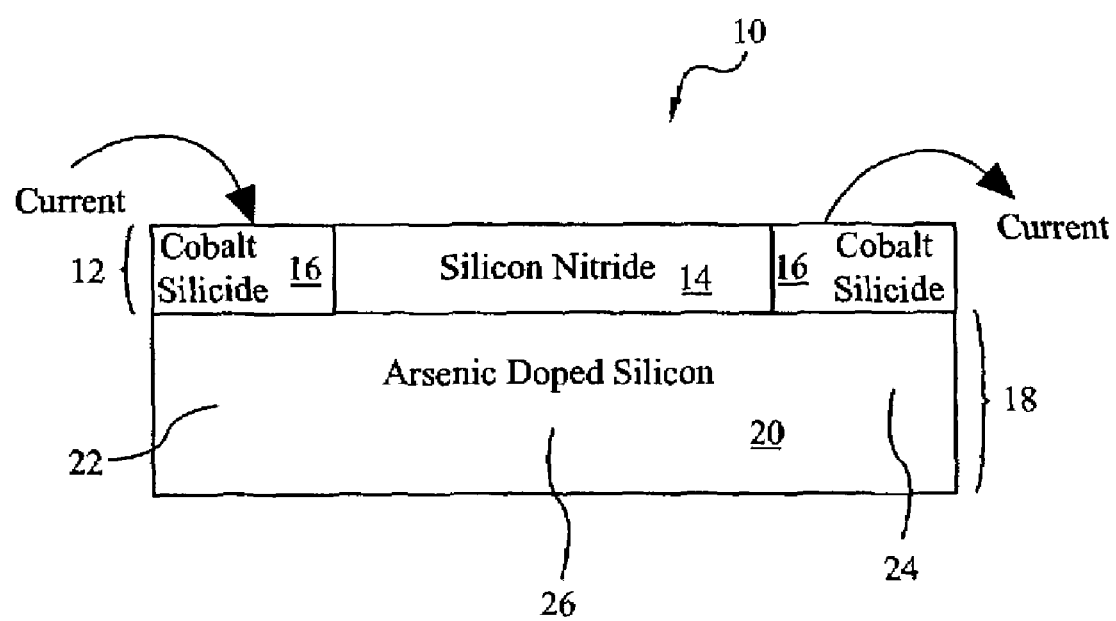
FIG. 2 is a side view of the programmable element of FIG. 1.

As shown in FIG. 2, which is a side view of the programmable element of FIG. 1, programmable element 10 comprises a second layer 18 in addition to first layer 12. Second layer 18 comprises a semiconductor material 20 in the form of a crystalline lattice that is doped with a dopant. Crystalline lattice 20 includes a first end 22, a second end 24, and a center portion 26, over which lie contact layer 16, cap layer 14, and contact layer 16, respectively. The lattice may be any substance satisfying semiconductor properties, for example silicon, germanium, and 4—4, 3–5, and 2–6 compound semiconductors. In some embodiments semiconductor material 20 does not comprise a lattice structure, as in the case of amorphous silicon, and in other embodiments comprises a pseudo-lattice structure such as polycrystalline silicon. The dopant may be any donor atom, including phosphorus, arsenic, antimony, or any acceptor atom including boron, aluminum, gallium, indium, etc. In this detailed description, an embodiment of the present invention comprising a silicon lattice 20 doped with arsenic will be particularly described, though it should be understood that such description is not intended in any way to limit the scope of the invention to that embodiment. The resistance of silicon lattice 20 is determined by the arrangement of the arsenic atoms within it. As will be further described below, the arsenic atoms tend to arrange themselves within the silicon in either an electrically inactive, less-conductive state, or an electrically activated state, where they contribute to a decrease in resistance. The present invention includes a method for placing the arsenic in an electrically activated state. Because this is accomplished by rearranging the bonding configuration of the dopant in programmable element 10, no substantial mechanical deformation of programmable element 10 results.

Figure 3:
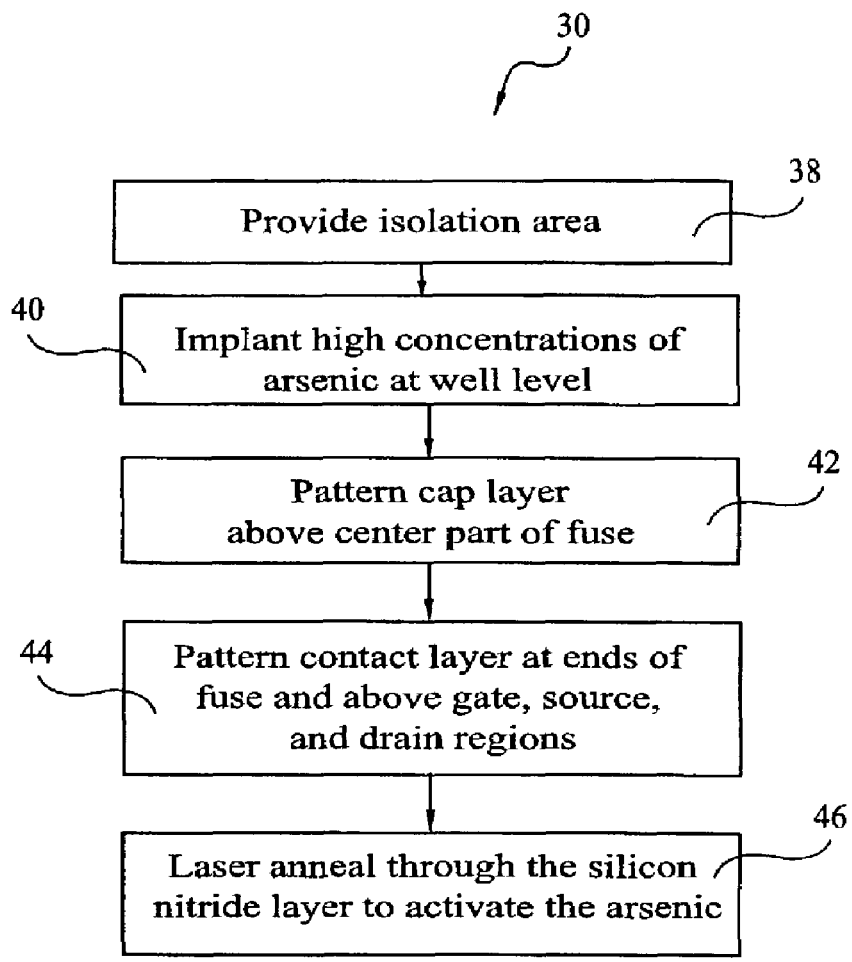
FIG. 3 is a flow diagram illustrating a fabrication method of a programmable element according to an embodiment of the present invention.

Referring now to FIG. 3, a method 30 for fabricating and activating a programmable element with a selectively conductive dopant according to one embodiment of the present invention is illustrated. The dopant is said to be selectively conductive because it may be manipulated by an operator to form either an activated, more highly conductive configuration, or a deactivated, less conductive configuration, in a manner that will be explained below. It should be noted that a more conductive device will be less resistive, and vice versa, and that the terms "conductive" and "resistive" will both be used from time to time herein, where appropriate and as convenience dictates.

Each step of method 30, briefly outlined here, will be particularly explained in connection with FIGS. 4–10, which illustrate one embodiment for carrying out method 30. In a first step 38 of method 30, a silicon wafer is provided with at least one isolation area. One conventional method for forming an isolation area is to pattern and etch the silicon and then provide it with silicon dioxide in a standard process that is well known in the art. One of ordinary skill in the art will readily recognize that the present invention is compatible with standard semiconductor fabrication processes. Not all of the fabrication steps that will be described below are necessary for the construction of the fuse, but it should be noted that none of the steps are incompatible with or harmful to the fuse.

A second step 40 of method 30 is to implant very high concentrations of arsenic at the well level of the FET device such that there is a large change in resistance between activation and deactivation. In random fashion, some of the arsenic atoms go into substitutional sites while some go into interstitial sites, which are not part of the lattice. In order for an atom to be electrically active it must not only occupy a substitutional site but must also be bonded in a certain configuration. That bonding configuration is one in which the atom may donate an electron to the crystal, and is known as an electrically active configuration. Following the implantation performed in second step 40, an unknown percentage of the arsenic atoms in substitutional sites is electrically active. The value of that percentage is not of great significance because it will be altered several times by subsequent processing steps, but the arsenic may be described in general at this stage as being primarily electrically inactive. Following second step 40, FET devices may be built on adjacent silicon islands. In other words, the present invention, as explained, permits chip elements to be placed in close proximity to each other, as well as in close proximity to FET devices. The construction of FET devices includes an anneal near 1000 degrees C. adapted to electrically activate dopant in the FET devices. At the same time, that anneal electrically activates the arsenic in the programmable element.

In a third step 42, a cap layer such as silicon nitride is placed over a center portion of the programmable element. During this step, the arsenic is deactivated, again due to the environment required by this phase of the fabrication process. Method 30 further includes a fourth step 44, in which contact layers, such as may be formed of cobalt silicide, are patterned above the ends of the programmable element and over the gate, source, and drain regions of the chip. This step includes a transformation anneal that is performed near 750 degrees C. and that lasts for a sufficient period to deactivate the arsenic. This 750 degree C. anneal deactivates the arsenic because it is performed at a lower temperature than the previous anneal. The relationship between temperatures in successive anneals largely determines whether a particular anneal will activate or deactivate the arsenic. An anneal performed at a lower temperature than the previous anneal, like the one performed in fourth step 44, will serve to deactivate the arsenic. Further anneals in subsequent steps may serve to deactivate the arsenic further.

A fifth step 46 of method 30 is to perform a laser anneal of the programmable element through the silicon nitride layer in order to again electrically activate the arsenic. When this is done, the result is a change in the resistance of the programmable element that is at least a factor of two. Much larger changes in resistance values may also be achievable, including in connection with alternate embodiments. It should be understood that the arsenic/silicon embodiment just described is just one example of a way the present invention may be configured, and is not intended to be limiting in any way. Antimony, indium, boron, gallium, and other substances, for example, may be used as dopant material, and germanium or silicon germanium, among others, may be used as a lattice.

Figure 4:
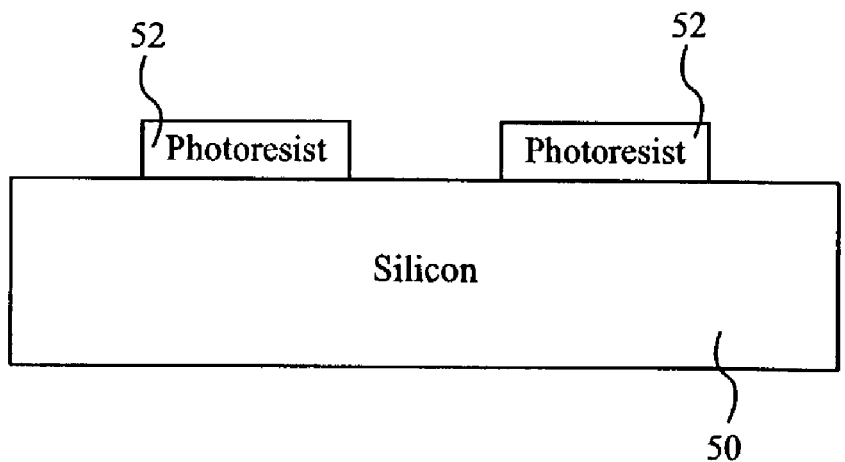
FIG. 4 is a side view of a semiconductor device during one phase of fabrication.
Figure 5:
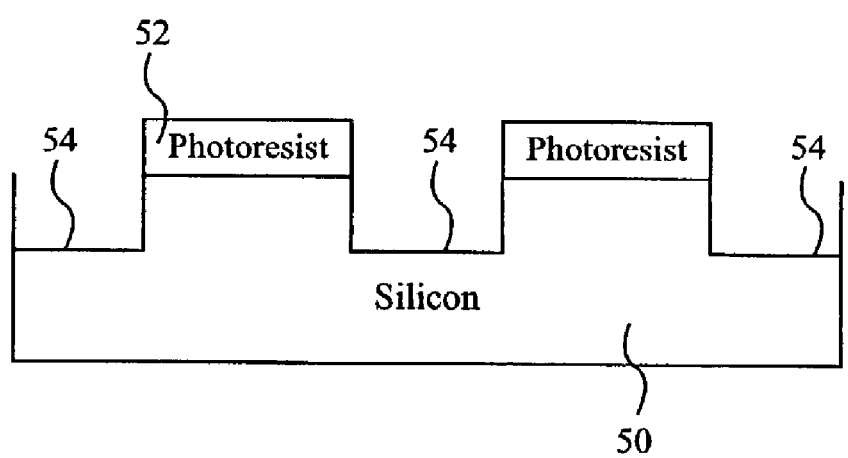
FIG. 5 is a side view of a semiconductor device during another phase of fabrication.

FIGS. 4–10 illustrate individual steps of method 30, and will now each be considered in turn. It will be clear from the following discussion that the method of the present invention may be compatible with conventional processing techniques. FIG. 4 depicts a photoresist 52 patterned over a silicon wafer 50. Photoresist 52 protects silicon 50 during a subsequent processing step, in a manner which is well known in the art. FIG. 5 shows silicon wafer 50 after it has been etched to create trenches 54. Note that silicon wafer 50 has been etched away everywhere except in those areas covered by photoresist 52. The patterned photoresist 52 may be removed after the etching step has been completed.

Figure 6:
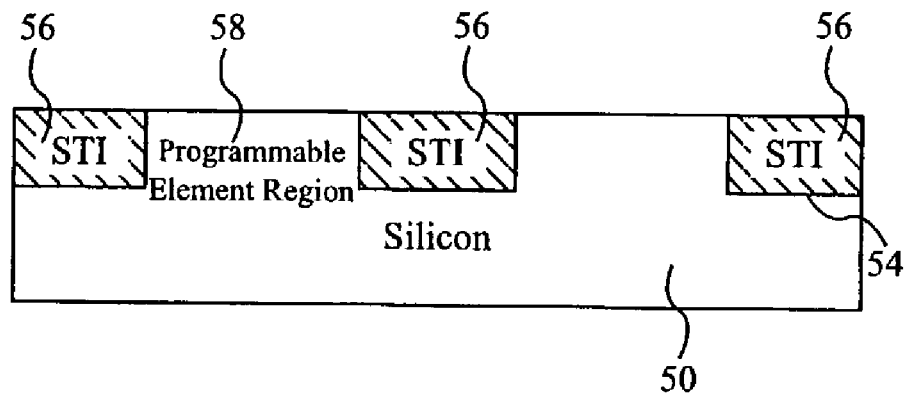
FIG. 6 is a side view of a semiconductor device during another phase of fabrication.

In FIG. 6, trenches 54 have been filled with silicon dioxide 56 in a process referred to as shallow trench isolation, or STI, and a programmable element region 58 of silicon wafer 50 has been identified. Programmable element region 58 is the location of second layer 18 of programmable element 10, shown in FIG. 2. In one embodiment, programmable element region 58 is at the well level of the device, meaning it is laid down before polysilicon is deposited. This is done so that dopant can be implanted into single-crystal silicon and exposed to the proper annealing conditions.

Figure 7:
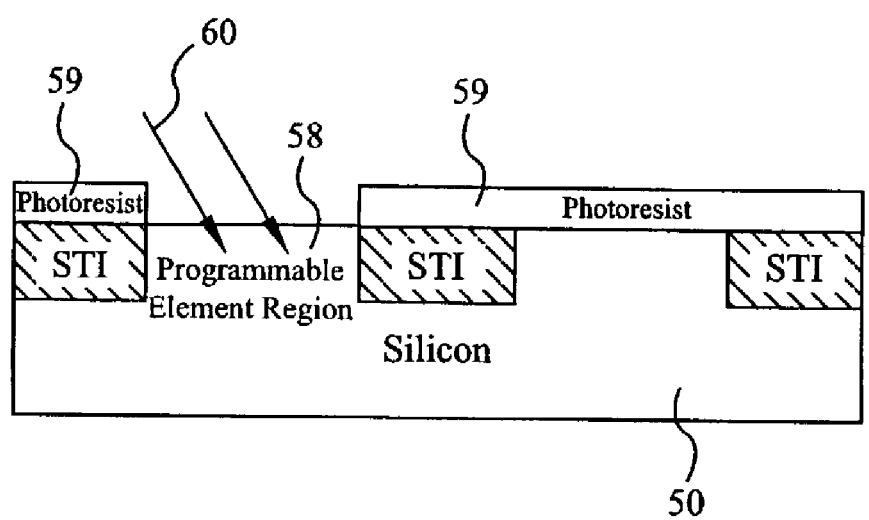
FIG. 7 is a side view of a semiconductor device during a doping phase of fabrication.

FIG. 7 corresponds to second step 40 of method 30, in which high concentrations of arsenic are implanted in programmable element region 58, as indicated by arrows 60. A blocking layer 59 prevents arsenic from being deposited where it is not wanted. Blocking layer 59 may comprise a layer of photoresist. The doping can be done to a very high dose without departing from standard semiconductor technology. With heavy doping, a large portion of the arsenic will be inactive in silicon wafer 50 until it is exposed to high-temperature anneals. Inactive or deactivated arsenic will not contribute significantly to the conductivity of the programmable element, so the element will be more resistive than it would be if all the arsenic were electrically activated.

Electrically active or activated arsenic is characterized by a bonding configuration where the arsenic atom occupies a lattice site (substitutional site) and four of the five electrons in the outermost shell of arsenic bond with four adjacent silicon atoms. The fifth electron is free to move through the silicon crystal. Electrically inactive or deactivated arsenic is characterized by either being unbonded in an interstitial site between lattice sites, or located in a substitutional site bonded to three adjacent silicon atoms and one vacancy site. A vacancy site is simply an empty site that would be occupied by an atom if the prevailing pattern of the lattice were followed everywhere. In this configuration, three of arsenic's five outer electrons bond to three silicon atoms, while the other two electrons reside in the vacancy and remain unbonded. This configuration does not contribute an electron to the silicon crystal. It is the presence of the free electron in the silicon that decreases the resistivity of the silicon. The electrical state of arsenic, (active or inactive), may be selected by varying the anneal temperature in the manner already discussed. The present invention takes advantage of the fact that there is an electrical solubility value at each temperature where the arsenic will combine with silicon in the electrically active configuration. As temperature increases, so does the electrical solubility, and additional arsenic atoms diffuse within the silicon lattice until they are located in a site surrounded by silicon atoms, forming the electrically active configuration. In other words, the higher the temperature, the greater the number of arsenic atoms that will enter the electrically active state.

Figure 8:
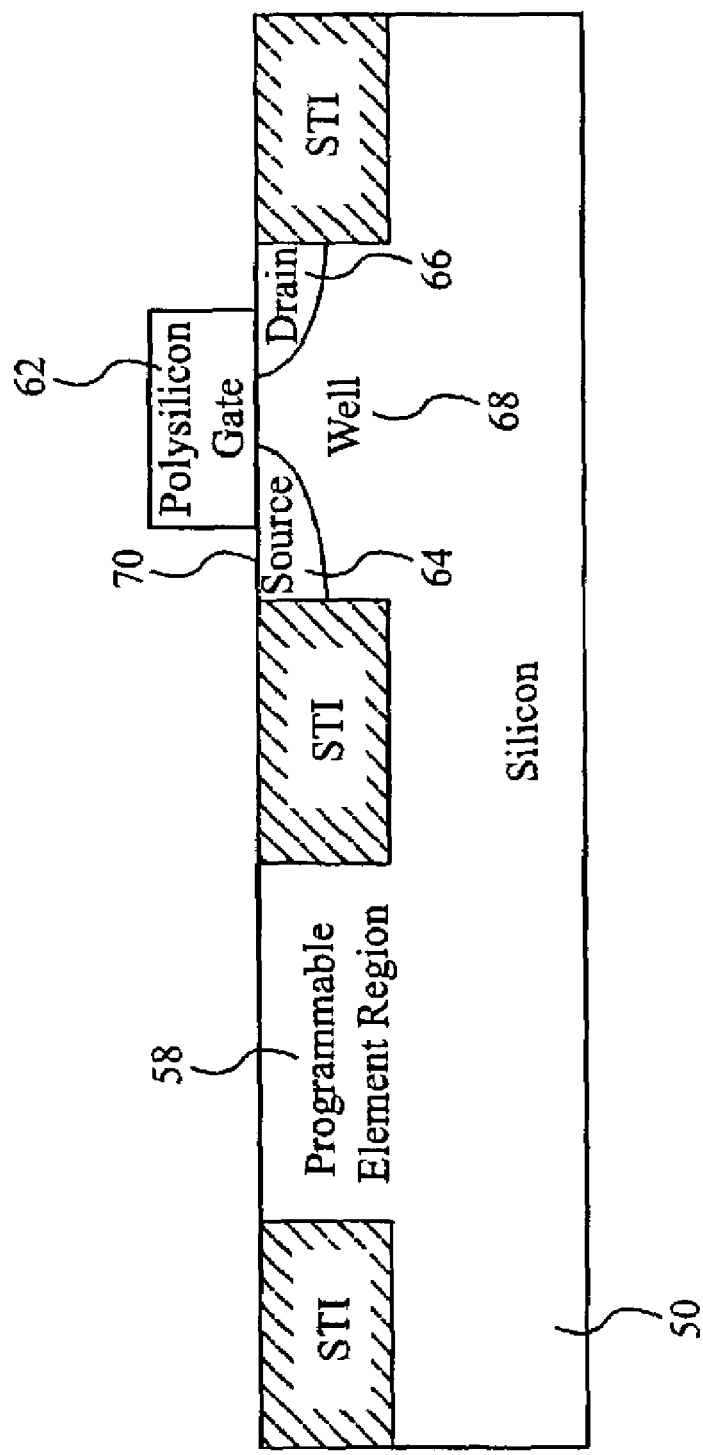
FIG. 8 is a side view of a semiconductor device during another phase of fabrication.
Figure 9:
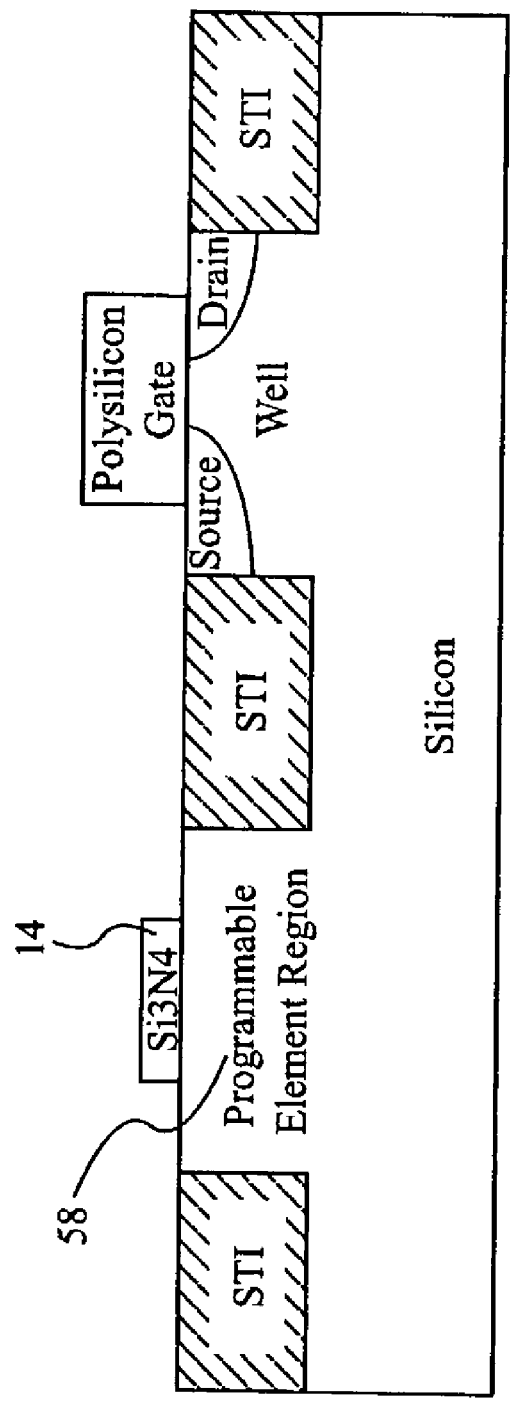
FIG. 9 is a side view of a semiconductor device during another phase of fabrication.

Referring now to FIG. 8, a FET device 62 has been built on a silicon island 70 of silicon wafer 50. Note that silicon island 70 may be located adjacent to programmable element region 58. Because the present invention may be programmed without requiring substantial mechanical deformation, FET device 62 may be located in close proximity to programmable element region 58 with decreased risk of damage to FET device 62. FET device 62 may be comprised of a gate conductor, such as a polysilicon gate bridging a source 64 and a drain 66 located in a well region 68. Any number of FET devices, of any description, may be constructed during this processing step, depending on the intended application for the semiconductor device. During this phase of fabrication, as has been described in connection with FIG. 3, a high temperature (1000 degrees C.) anneal activates some of the arsenic. FIG. 9 shows that a cap layer 14 has been patterned above the center part of programmable element region 58. (Also see FIG. 2 for the location of cap layer 14.) Cap layer 14 serves as a blocking layer to prevent the formation of silicide in areas where it is not wanted. For example, the cobalt silicide contact pads discussed in connection with FIG. 10 must not be connected by metal or else the fuse would short. Cap layer 14 also serves as a window through which programmable element region 58 may be accessed by actinic radiation in the programming process.

Figure 10:
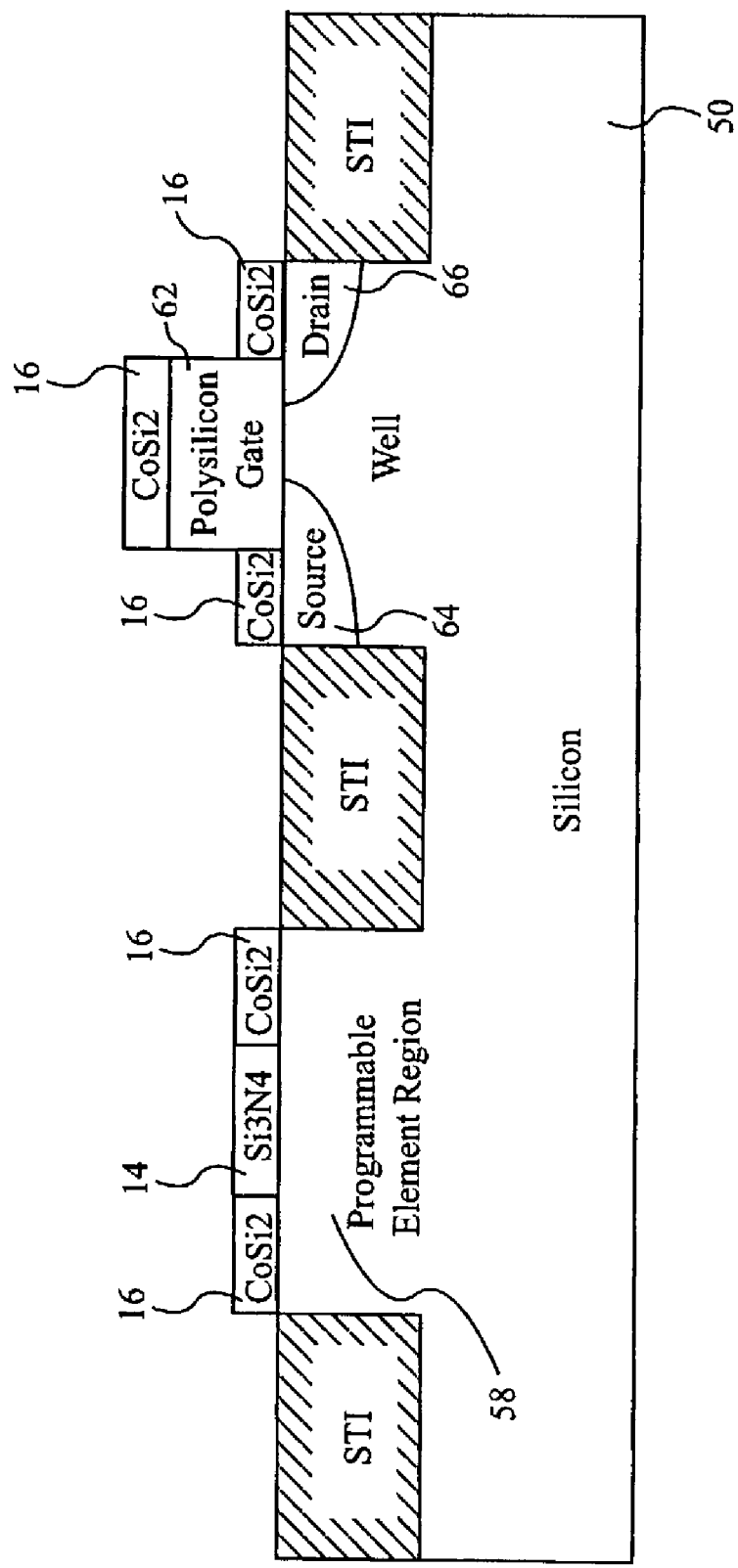
FIG. 10 is a side view of a semiconductor device during another phase of fabrication.

FIG. 10 depicts a silicon wafer 50 that has been provided with contact layer 16, which may in at least one embodiment comprise cobalt silicide. Contact layer 16 is patterned over a portion of wafer 50, including gate 62, with source 64 and drain 66, as is conventional in semiconductor processing. Contact layer 16 has also been patterned over the first and second ends (see FIG. 2) of programmable element region 58 in order to provide electrical contact to the programmable element. During this part of the fabrication process, as previously described in connection with FIG. 3, there is a low temperature (approximately 400 to 750 degrees C.) anneal that, because it occurs at a lower temperature than the previous anneal, deactivates the arsenic. Cap layer 14 isolates portions of contact layer 16 above programmable element region 58, as was described in connection with FIG.

9. FIG. 10 corresponds to fourth step 44 of method 30, and in at least one embodiment marks the end of the fabrication process of a chip containing a programmable element of the type described by the present invention.

Figure 11:
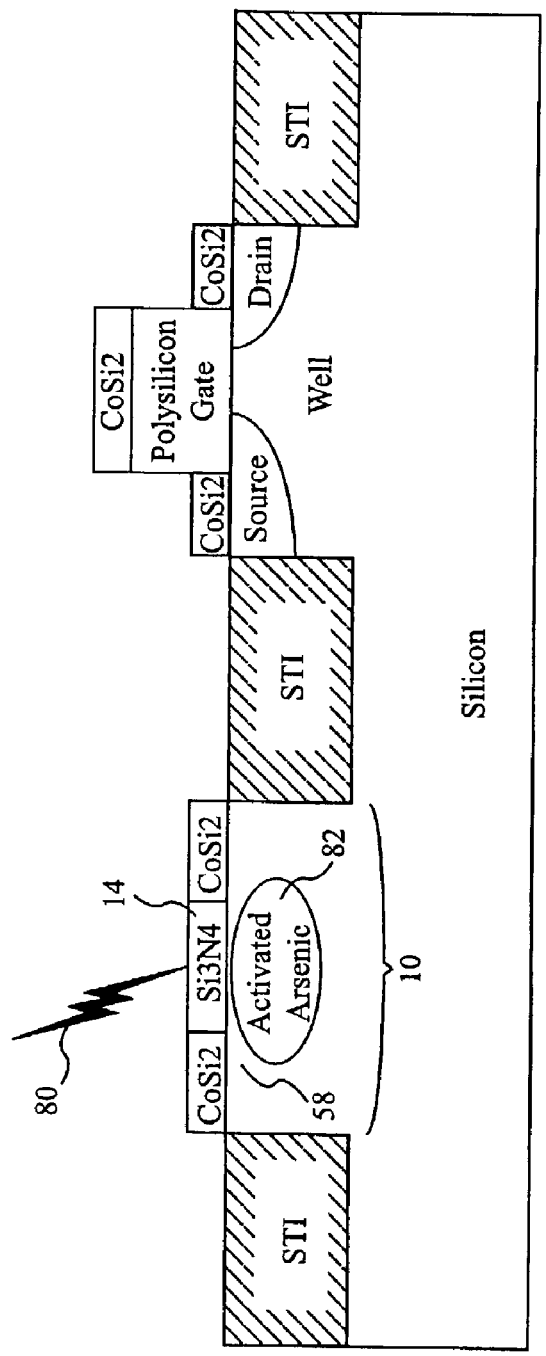
FIG. 11 is a side view of a semiconductor device undergoing a laser anneal process.

Referring now to FIG. 11, actinic radiation 80 is directed through the window provided by cap layer 14 into programmable element region 58. Actinic radiation 80 heats programmable element region 58 to a temperature sufficient to force arsenic atoms into the electrically active configuration within the silicon lattice, resulting in a region 82 of activated arsenic. In one embodiment, actinic radiation 80 is supplied by a laser, not shown, in a laser anneal process that heats programmable element region 58 to approximately 1200 degrees C., thus exposing programmable element region 58 to what may be the highest temperature it ever experiences. Arsenic does not necessarily need to be heated to that temperature in order to force it into its active state; the laser anneal is used because the laser-provided radiation allows programmable element 10 to cool so rapidly that the arsenic stays fixed in the active state. The laser anneal heats programmable element 10 hot enough that the arsenic atoms can move to the electrically active state, and then cools so rapidly that the arsenic is frozen into place, still in the active state. Such rapid cooling times, representing very small fractions of a second, are possible because the amount of matter that is heated by the laser is very small. Other heating processes lead to slow cooling times during which some of the arsenic reverts to an electrically inactive state.

After the rapid cool facilitated by the laser, programmable element 10, along with the rest of the chip, is at an operating temperature that never goes above roughly 200 degrees C. This is well below the activation/deactivation mechanism. Below roughly 400 degrees C. there is not enough energy to allow the atoms to migrate in the lattice. As long as the chip is not exposed to temperatures greater than 400 degrees C., the arsenic in programmable element 10 will remain active, and the element will remain programmed correctly. Because there are many reasons temperatures of 200 degrees or greater would be harmful to the chip, the chance of it being subjected during normal use to that kind of environment are low. It is interesting to note, however, that an exposure to temperatures like 500 degrees is one method of deprogramming or un-writing the programmable element, so that it would at least be possible, however unlikely in practice, to further program element 10 even after a laser anneal or other programming event had been performed.

Note that the laser anneal may be performed after the complete construction and testing of the chip. The arsenic doped silicon would be buried under many layers of silicon dioxide (not shown) and silicon nitride, including cap layer 14, used in the upper levels of the chip, but programmable element region 58 may be reached using a laser of appropriate wavelength. More specifically, the silicon dioxide and silicon nitride material do not absorb laser light radiation for wavelengths of light longer than 248 nm, meaning the laser anneal may be performed using a laser beam having a wavelength of light ranging from 248 nanometers (nm) to 1107 nm. The 308 nm wavelength excimer laser is a laser conventionally used to melt silicon, and, because it falls within the appropriate range given above, is a good candidate for supplying the laser light, although lasers of other types and wavelengths may also be used.

The present invention may also be used as a trimmable resistor application. In analog circuits, among other places, there is often a need for a resistor having a specific precise resistance. To meet that need, a programmable element roughly five times the length of the present invention may be constructed. Small sections of the element may be modified, according to the methods set forth herein, to change the total resistance of the element until it reached a specific desired value. The programmable element could, for example, be tested to determine its resistance, be subjected to a brief laser anneal to electrically activate a portion of the arsenic or other dopant, then tested again to see how the resistance changed. The process could be repeated until a specific desired resistance value is reached.

The foregoing description has described selected embodiments of a programmable element comprising a semiconductor material doped with a dopant that alters the resistance of the element when exposed to actinic radiation. Rather than producing a mechanical deformation, the radiation rearranges the bonding configuration of the dopant in the element, allowing it to be placed on a chip in close proximity to other chip structures without risking damage to those structures. After formation, the programmable element is subjected to a laser anneal process in which the dopant is electrically activated. The activation process allows the dopant to donate a charge carrier to the silicon crystal. Rapid cooling following laser anneal preserves the desired electrically active structure produced in the programmable element.

While the invention has been particularly shown and described with reference to selected embodiments thereof, it will be readily understood by one of ordinary skill in the art that, as limited only by the appended claims, various changes in form and details may be made therein without departing from the spirit and scope of the invention. For example, dopant implantation could take place at a later stage of the fabrication process, after all the high temperature anneals have been completed, and a laser used to activate the dopant after the metallization step. It may also be possible to implant at the end of the process by etching windows in the metal and the adjacent oxide, implanting the dopant, then filling the openings and laser annealing the chosen fuses.

What is claimed is:

1. A method of selecting a specific precise resistance in a programmable element that comprises a semiconductor material, said method comprising the steps of:
    doping the semiconductor material with a dopant that decreases said resistance when said element is exposed to actinic radiation, said radiation causing substantially no mechanical deformation of said element;
    exposing said programmable element to said actinic radiation for a first length of time;
    determining a test resistance value of said programmable element;
    comparing said test resistance value to said specific precise resistance; and
    if said test resistance value does not equal said specific precise resistance, exposing said programmable element to said actinic radiation for said first length of time and repeating said steps of determining and comparing said resistance values.

2. The method of claim 1, wherein the providing step includes providing shall trench isolation within the semiconductor material for isolating the programmable element within the semiconductor material.

3. The method of claim 1, wherein the actinic radiation has a wavelength in a range of 248 nanometers to 1107 nanometers.

4. The method of claim 1, wherein actinic radiation is laser radiation, and wherein each said exposing comprises exposing said programmable element with said laser radiation for said first length of time which results in heating said programmable element to an elevated temperature.

5. The method of claim 1, wherein the method further comprises the step of forming a layer on the semiconductor material, wherein the layer comprises a cap portion that includes an insulative material such that the cap portion is in direct mechanical contact with the semiconductor material, and wherein during each said exposing the actinic radiation strikes an uncovered surface of the cap portion, passes through the insulative material of the cap portion, and propagates into the programmable element.

6. The method of claim 4, wherein after said comparing determines that the resistance value equals said specific precise resistance, the method further comprises rapidly cooling the programmable element from the elevated temperature to an operating temperature.

7. The method of claim 5, wherein the doping step is performed before the step of forming a layer.

8. The method of claim 5, wherein the doping step is performed after the step of forming a layer.

9. The method of claim 5, wherein the cap portion of the layer includes silicon dioxide.

10. The method of claim 5, wherein the cap portion of the layer includes silicon nitride.

11. The method of claim 5, wherein the step of forming a layer includes forming a conductive contact within the layer such that the contact is in direct mechanical contact with the cap portion and with the semiconductor substrate.

12. The method of claim 5, wherein the actinic radiation has a wavelength such that the actinic radiation is essentially unabsorbed by the cap portion of the layer.

* * * * *